United States Patent [19]
Garbers et al.

[11] Patent Number: 5,748,537
[45] Date of Patent: May 5, 1998

[54] METHOD AND APPARATUS FOR STORING ITEMS IN FLASH MEMORY

[76] Inventors: Jeffrey Paul Garbers, 300 Buckingham Forest Ct., Roswell, Ga. 30075; Dennis Drew Moseley, 313 Greenhouse Pkwy., Alpharetta, Ga. 30202

[21] Appl. No.: 799,907
[22] Filed: Feb. 13, 1997
[51] Int. Cl.$^6$ ................................. G11C 11/34
[52] U.S. Cl. .................... 365/185.33; 365/185.29; 365/185.08
[58] Field of Search ............ 365/185.33, 185.29, 365/185.08, 185.18

[56] References Cited

U.S. PATENT DOCUMENTS

| | | | |
|---|---|---|---|
| 5,390,148 | 2/1995 | Saito | 365/185.08 X |
| 5,544,119 | 8/1996 | Wells et al. | 365/185.33 X |
| 5,619,452 | 4/1997 | Miyauchi | 365/185.29 |
| 5,627,783 | 5/1997 | Miyauchi | 365/185.33 |

*Primary Examiner*—David C. Nelms
*Assistant Examiner*—Huan Hoang
*Attorney, Agent, or Firm*—J. Ray Wood

[57] ABSTRACT

An electronic device (100) stores an item (135) including bits of information. The electronic device (100) includes a flash memory (125) that stores the item (135) in binary form and a flash manager (120) that receives a modified item to be stored in the same location as the item (135). The flash manager (120) determines whether replacing the item (135) with the modified item involves any bit transitions from zero to one. When no bit transitions from zero to one are involved, the flash manager (120) changes selected bits from one to zero to replace the item (135) with the modified item in place, without copying any stored information to a different memory location, such as a different region of the flash memory or a different memory device (115).

20 Claims, 2 Drawing Sheets 5,748,537

METHOD AND APPARATUS FOR STORING ITEMS IN FLASH MEMORY

FIELD OF THE INVENTION

This invention relates in general to memory storage, and more specifically to storage of information in a flash memory device.

BACKGROUND OF THE INVENTION

Flash memory is used in many types of electronic devices as a persistent storage device. It can be changed by programming, but it retains its contents even in the absence of power. Since it has no moving parts, flash memory is especially useful in battery powered devices, such as portable messaging units, in which low power consumption and ruggedness are advantageous.

Most electronic devices using flash memory have a disk-oriented model of persistent storage. In other words, conventional electronic devices treat flash memory as if it were a disk drive. As a result, information from the flash memory must be copied a sector at a time into random access memory before the information can be read or executed. The sector size, which is typically determined at compile time, is fixed, usually at two-hundred-fifty-six (256) or five-hundred-twelve (512) bytes. Therefore, reading information and executing information stored in the flash memory are performed inefficiently in prior art devices.

The disk model also incurs significant overhead when storing small items. Storage is allocated in sectors of a fixed size, regardless of item size. Even a small item, such as a one-byte item, takes up an entire sector. In small electronic devices in which storage space is at a premium, this aspect of the disk model is especially undesirable.

Additionally, a characteristic of flash memory is that it can only be written in a single direction. More specifically, flash memory can only be written from a binary one to a binary zero. A given bit can never be changed from a zero to a one without initializing the entire "erase block" in which the bit resides. Erase block size is predetermined by the manufacturer of the flash memory and is often as large as one-hundred-twenty-eight (128) kilobytes.

When information stored in flash memory is to be modified, conventional electronic devices copy the sector in which the information is stored into random access memory, modify the information, and recopy the entire sector back into an unused portion of the flash memory. The out-of-date sector is then marked as invalid. This process can be followed as long as sufficient space remains available in the flash memory.

Typically, conventional devices will write into all erase blocks of the flash memory except for a reserved erase block. The reserved erase block is held in an initialized state until all other erase blocks have been filled. Once the other portions of the flash memory are filled, a modification to stored information is performed by copying valid sectors of the entire affected erase block, including the modified information, into the reserved erase block. Thereafter, the entire erase block from which the information has been copied is initialized to binary ones. This erase block is then used as the reserved erase block for subsequent modifications. It can be seen that this method of modifying stored information consumes extra time and extra memory space.

Thus, what is needed is a way to more efficiently use a flash memory in an electronic device.

DESCRIPTION OF A PREFERRED EMBODIMENT

Figure 1:
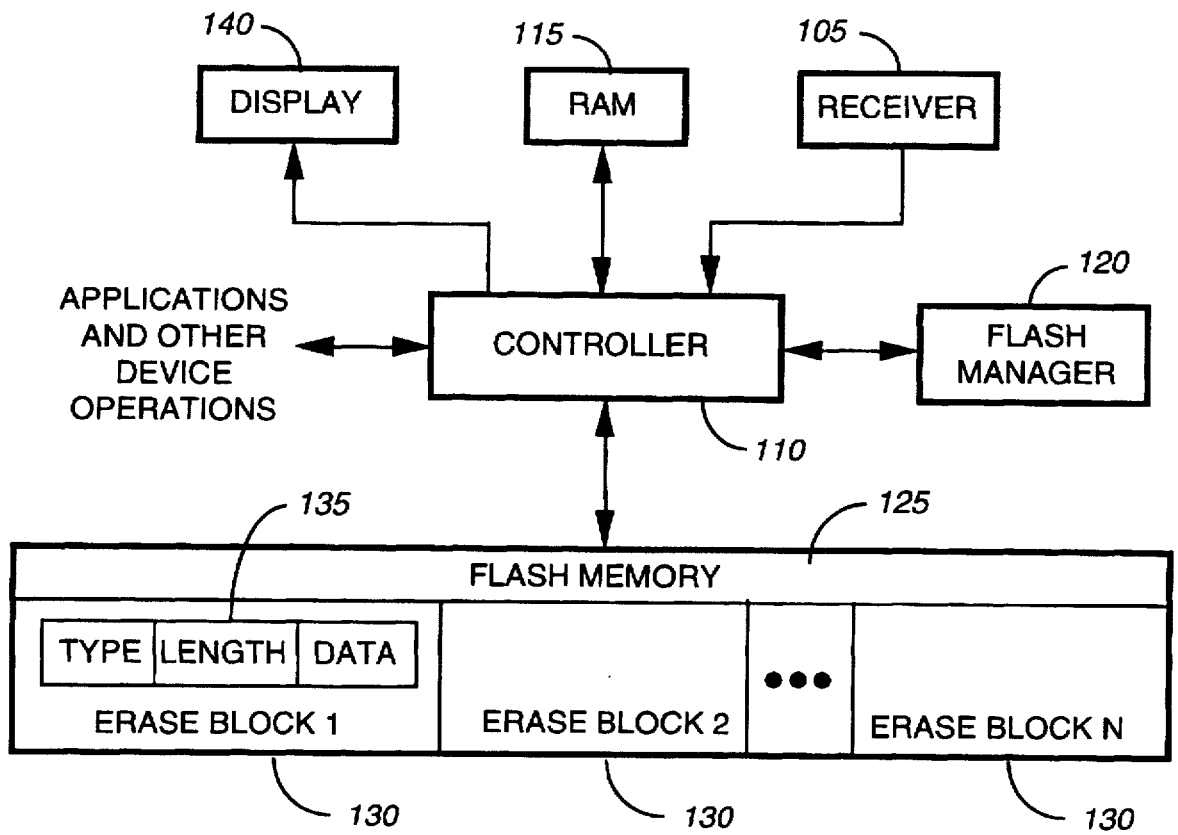
FIG. 1 is an electrical block diagram of an electronic device including a flash memory for storing information in accordance with the present invention.

FIG. 1 is an electrical block diagram of an electronic device 100, such as a portable messaging unit or selective call receiver, that includes a flash memory 125 for persistent storage of information in binary form, i.e., in the form of bits of information set to binary ones or binary zeros. According to the present invention, the electronic device 100 includes a different memory device, such as a random access memory (RAM) 115 for temporarily storing data and a flash manager 120 for managing the storage of information in and the retrieval of information from the flash memory 125. A controller 110 is included for controlling operations of the electronic device 100, for interfacing with other device operations, and for receiving inputs from software applications. When the electronic device 100 comprises a selective call receiver, it can also include a receiver 105 for receiving and decoding a radio signal to recover a message and a display 140 for presenting the message to a user. The message can, for instance, be stored in the flash memory 125 along with a flag set to indicate whether the message has been presented.

The flash memory 125 includes erase blocks 130 that can be erased without affecting other erase blocks 130 in the flash memory 125. The erase blocks are set by the manufacturer to a predetermined size that can be as large as one-hundred-twenty-eight (128) kilobytes. Bits of the erase blocks are initialized to binary ones, subsequent to which selected bits can be changed to binary zeros to store information. Preferably, the information is stored as flash items 135 that include type information, length information, and data. The type information indicates the data type. Data types could be, for instance, personal messages, mail drop messages, operational parameters, or any other type of information for which persistent storage is desirable. The length information indicates the actual size of the data. Flash items are preferably stored in multiples of four (4) bytes and are contained in at least one erase block 130. It is also preferable that an item 135 be stored within a single erase block 130, although items requiring a large amount of storage space could be stored in more than one erase block 130.

A characteristic of flash memory is that a given bit cannot be changed from a binary zero to a binary one without initializing the entire erase block in which the bit resides. Conventionally, replacement of a stored item with a modified item is performed by copying the sector including the item into RAM, modifying the item in the RAM, then copying the modified sector into an unused portion of the flash memory. The out-of-date sector is then marked invalid and no further information can be copied into the invalid sector until the entire erase block that includes the invalid sector has been initialized. This modification process is followed as long as sufficient space, excluding a reserved erase block, is available in the flash memory.

Typically, all erase blocks are available except for a reserved erase block, hereinafter referred to as a reserve block. The reserve block is held in an initialized state until all other erase blocks have been filled, in which case a subsequently received modification is handled differently than summarized above. Specifically, a modification is performed by copying all of the valid erase block information, as modified, from the affected erase block into the reserve block. The erase block from which the information was copied is then initialized so that it includes all binary ones, and the initialized erase block is subsequently utilized as the reserve block.

Conversely, the electronic device 100 according to the present invention permits, under some circumstances, modification of flash-stored information "in place" without initialization of the entire erase block, even when unreserved blocks of the flash memory 125 are full, and without copying any stored information in the erase block into another memory location, such as a different region of the flash memory 125 or a different memory device.

Specifically, when writing to a particular flash location involves only bit transitions from one to zero, a modified item is written into the location in place. In this manner, the original item can be conveniently replaced with the modified item without copying the affected sector into another memory device and then into another erase block and, when unreserved erase blocks are filled, without initializing the affected erase block or copying the erase block into the reserve block of the flash memory 125. Only when a given modification involves bit transitions from zero to one is the stored information copied into another memory location or the erase block initialized. As a result, flash storage of information, such as received messages, is performed more rapidly and more efficiently by the electronic device 100 than by conventional devices.

Prior art devices that use flash memory also have a disk-oriented model of persistent storage in which the flash memory is divided into sectors having a fixed sector size of usually two-hundred-fifty-six (256) bytes or five-hundred-twelve (512) bytes. Before information can be read or executed, the flash information is copied a sector at a time into RAM, which can cause delays in accessing the information and which inefficiently utilizes memory resources. In prior art devices, an item of information always consumes one or more sectors regardless of the actual size of the item. This also wastes flash memory space, which is undesirable in small electronic devices such as portable messaging units.

In the electronic device 100, the flash memory 125 is not divided into sectors or treated as if it were a disk. Instead, flash items are stored in contiguous memory blocks, preferably arranged in even multiples of four (4) bytes, so that the smallest of flash items can be stored in a mere four (4) bytes. Therefore, a much greater number of flash items can be stored in the flash memory 125 configured according to the present invention. Additionally, the electronic device 100 according to the present invention permits in place reading and execution of flash information by a software application when the operation does not require manipulation of the stored information by the requesting application, resulting in relatively rapid data access and efficient memory use.

Figure 2:
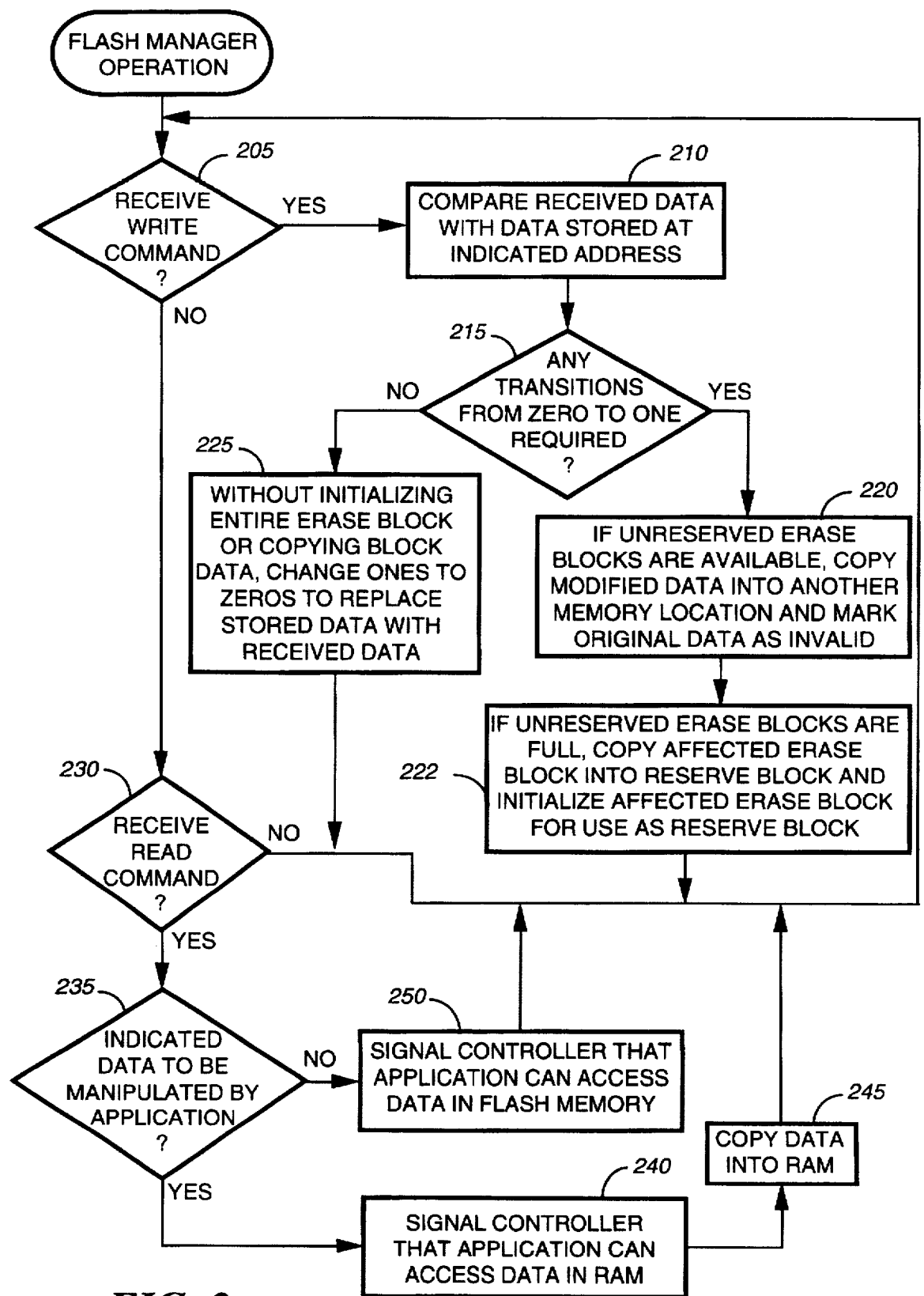
FIG. 2 is a flowchart illustrating an operation of a flash manager included in the electronic device of FIG. 1 in accordance with the present invention.

Referring next to FIG. 2, a flowchart of an operation of the flash manager 120 is depicted. When, at step 205, the flash manager 120 receives a write command from the controller 110 (FIG. 1), the flash manager 120 compares, at step 210, the data received with the write command to the data already stored in the flash memory 125 at the address indicated by the command. The flash manager 120 then determines, at step 215, whether the received data can be written over the stored data without changing any addressed bits from binary zero to binary one. When no bit transitions from zero to one are necessary, the received data is conveniently stored in place by changing, at step 225, the appropriate binary ones to zeros, thereby replacing the original data with the received data. This is done without copying the information into another erase block and, when unreserved blocks of the flash memory 125 are full, without copying all valid erase block information into the reserve block and having to initialize the entire erase block in which the data is located When, on the other hand, bits need to be changed from zero to one in order to replace the stored data with the received data, i.e., in order to modify the stored data, the modification is performed, at step 220, by copying the affected information, in multiples of four (4) bytes, into another memory location. The other memory location can comprise another erase block or, if there is sufficient available space, the same erase block. In this way, the modified information is stored in the other memory location. The original information in the original erase block is then marked as invalid, such as by flagging the information or setting a bit to a predetermined value indicative of invalidity. When bits need to be changed from zero to one and all unreserved erase blocks are full, modification of the information is performed, at step 222, in a conventional manner. Specifically, all of the valid information in the relevant erase block is copied, as modified, into a reserved erase block, then the entire erase block is initialized to set the bits of the block to binary ones. Thereafter, the initialized erase block becomes the reserve block that is held in an initialized state for subsequent memory modifications.

When, at step 230, a read command is received from the controller 110, the flash manager 120 determines, at step 235, whether the data at the indicated address is to be manipulated by the requesting software application. This can be done, for instance, by referencing the access request from the application to determine whether a read command or an execute command, as opposed to a write command or a modify command, was sent by the application. When a read or execute command was sent, indicating that the application does not intend to manipulate the data, the flash manager 120 sends, at step 250, a "permit" signal to the controller 110 indicating that the application is permitted to access the data within the flash memory 125. In response, the application is routed by the controller 110 directly to the addressed location of the flash memory 125 to allow in place read and execution operations.

When a write or modify command was sent, indicating that the application intends to manipulate the data, the flash manager 120 sends, at step 240, a "deny" signal to the controller 110 indicating that the application is not permitted to access the data within the flash memory 125. The flash manager 120 also, at step 245, copies the addressed data into the RAM 115. In response to receiving the deny signal, the controller 110 routes the requesting software application to the proper RAM location for accessing the data. When the application subsequently presents the controller 110 with the manipulated data, operation of the flash manager 120 resumes at step 205.

It will be appreciated by one of ordinary skill in the art that the permit and deny signals can comprise any predetermined signals, the meaning of which is known to both the flash manager 120 and the controller 110. For instance, different predetermined patterns of bits of bits or pulses of predetermined voltages could be sent to the controller 110.

In summary, the electronic device as described above includes a flash memory as well as a flash manager for managing data storage and data access with respect to the flash memory. Under some circumstances, writing to the flash memory can be done "in place". More specifically, when the modification of stored data requires only bit transitions from one to zero, selected bits are changed from one to zero within the flash memory to modify the data. According to the present invention, this is done without copying the original information in the relevant erase block into RAM for modification and subsequent storage in another erase block and without, when unreserved erase blocks are full, copying the entire erase block into a reserved block and then initializing the entire erase block. As a result, memory space is efficiently used, which is desirable in small electronic devices, such as selective call receivers, having limited memory resources. Also, fewer operations are required to modify the information, resulting in a relatively fast write operation that only minimally depletes a battery powering the device.

In prior art devices, sectors of information in an erase block are automatically copied into RAM for modification when an item in the block is to be modified, and the modified information is then automatically copied into a different erase block, thereby consuming additional memory space. When, prior to modification, available erase blocks are already filled with information, all valid data of the affected erase block is typically copied into a reserved erase block, and the original erase block is then automatically initialized and subsequently used as the reserve block. This is done regardless of whether bit transitions from zero to one are necessary, so time and memory space can often be needlessly consumed.

Another advantage of the present invention is that reading and executing flash items can be done directly from the flash memory, without first copying the requested items into RAM. Therefore, software applications can more quickly access data as long as it is not to be modified. Additionally, flash items are stored in multiples of four (4) bytes so that a large number of items can be stored.

Conventionally, a flash memory is treated like a disk and divided into sectors, each of which is allocated for storage of only a single item. When an item in a sector is to be accessed, the entire sector is automatically copied into RAM. The requesting application must then access the item in RAM rather than in the flash memory, whether or not the item is to be manipulated or modified. As a result, these conventional operations waste memory space, time, and battery capacity in comparison to the operations of the electronic device according to the present invention.

It will be appreciated by now that there has been provided a more efficient way to use flash memory in an electronic device.

What is claimed is:

1. An electronic device for storing an item comprising bits of information, the electronic device comprising:
    a flash memory that stores the item in binary form; and
    a flash manager that determines whether replacing the item with a modified item involves any bit transitions from zero to one and that changes, when no bit transitions from zero to one are involved, selected bits from one to zero to replace the item with the modified item without copying any stored information to a different memory location.

2. The electronic device of claim 1, wherein the flash memory is divided into erase blocks of a predetermined size, wherein the item is stored in at least one erase block, and wherein the selected bits are changes from one to zero without initializing any of the erase blocks, including the at least one erase block.

3. The electronic device of claim 2, further comprising:
    a random access memory (RAM), coupled to the flash manager, into which information included in the at least one erase block is, when bit transitions from zero to one are involved, copied into the RAM prior to storing the modified item in the flash memory.

4. The electronic device of claim 3, wherein the item and the modified item include type information, length information, and data.

5. The electronic device of claim 3, wherein the item and the modified item stored by the flash memory occupy multiples of four bytes.

6. The electronic device of claim 3, further comprising:
    a controller that provides the flash manager with a write command including the modified item and an address within the flash memory where the item is located.

7. The electronic device of claim 3, further comprising:
    a controller, coupled to the flash manager, for receiving inputs from a software application, the inputs indicative of the item, wherein, when the item is not to be manipulated by the software application, the item can be accessed by the software application within the flash memory without copying the item to a different memory device.

8. A selective call receiver for receiving messages, the selective call receiver comprising:
    a receiver that receives a message;
    a display, coupled to the receiver, that presents the message;
    a flash memory that stores the message as an item in binary form; and
    a flash manager that determines whether replacing the item with a modified item involves any bit transitions from zero to one and that changes, when no bit transitions from zero to one are involved, selected bits from one to zero to replace the item with the modified item without copying any stored information to a different memory location.

9. The selective call receiver of claim 8, wherein the flash memory is divided into erase blocks of a predetermined size, wherein the item is stored in at least one erase block, and wherein the selected bits are changes from one to zero without initializing any of the erase blocks, including the at least one erase block.

10. The selective call receiver of claim 9, further comprising:
    a random access memory (RAM), coupled to the flash manager, into which information included in the at least one erase block is, when bit transitions from zero to one are involved, copied into the RAM prior to storing the modified item in the flash memory.

11. The selective call receiver of claim 10, wherein the item and the modified item include type information, length information, and data.

12. The selective call receiver of claim 10, wherein the item and the modified item stored by the flash memory occupy multiples of four bytes.

13. The selective call receiver of claim 10, further comprising:
    a controller that provides the flash manager with a write command including the modified item and an address within the flash memory where the item is located.

14. The selective call receiver of claim 10, further comprising:
    a controller, coupled to the flash manager, for receiving inputs from a software application, the inputs indicative of the item, wherein, when the item is not to be manipulated by the software application, the item can be accessed by the software application within the flash memory without copying the item to a different memory device.

15. The selective call receiver of claim 10, wherein:

the item comprises the message and a flag set to indicate that the message has not been presented by the display; and the modified item comprises the message and the flag, wherein the flag is set to indicate that the message has been presented by the display.

16. A method for storing information in an electronic device including a flash memory, the method comprising the steps of:

storing an item in binary form in the flash memory at a location indicated by an address;

receiving a modified item to be stored in the location indicated by the address;

determining whether replacing the item with the modified item involves any bit transitions from zero to one; and changing, when no bit transitions from zero to one are involved, selected bits in the location from one to zero to replace the item with the modified item without copying any of the information stored in the flash memory to a different memory location.

17. The method of claim 16, wherein the flash memory is divided into erase blocks of a predetermined size, wherein the item is stored in at least one erase block, and wherein the changing step comprises the step of:

changing the selected bits from one to zero without initializing any of the erase blocks, including the at least one erase block.

18. The method of claim 17, further comprising, subsequent to the determining step, the step of:

copying, when bit transitions from zero to one are involved, the item, as modified, into the different memory location to store the modified item in the flash memory.

19. The method of claim 17, further comprising, subsequent to the determining step, the steps of:

copying, when bit transitions from zero to one are involved and when unreserved erase blocks of the flash memory are full, data stored in the at least one erase block into a reserved erase block, to store the modified item; and initializing all bits of the at least one erase block to binary ones.

20. The method of claim 19, further comprising, prior to receiving the modified item, the steps of:

receiving an input indicative of the item from a software application;

determining whether the item is to be manipulated by the software application; and permitting, when the item is not to be manipulated by the software application, the software application to access the item within the flash memory without copying the item to the different memory location.

* * * * *